US011302757B2

(12) United States Patent
Shim et al.

(10) Patent No.: US 11,302,757 B2
(45) Date of Patent: Apr. 12, 2022

(54) ELECTROLUMINESCENT DISPLAY APPARATUS INCLUDING PLURALITY OF GROOVES OVERLAPPING BANK HOLE BETWEEN ADJACENT SUBPIXELS

(71) Applicant: LG Display Co., Ltd., Seoul (KR)

(72) Inventors: Sungbin Shim, Paju-si (KR); Suhyeon Kim, Paju-si (KR); YuCheol Yang, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 258 days.

(21) Appl. No.: 16/518,425

(22) Filed: Jul. 22, 2019

(65) Prior Publication Data

US 2020/0144342 A1   May 7, 2020

(30) Foreign Application Priority Data

Nov. 2, 2018   (KR) .................. 10-2018-0133246

(51) Int. Cl.
*H01L 27/32* (2006.01)
*H01L 51/52* (2006.01)
*H01L 51/50* (2006.01)

(52) U.S. Cl.
CPC ...... *H01L 27/3246* (2013.01); *H01L 51/5056* (2013.01); *H01L 51/5206* (2013.01); *H01L 51/5221* (2013.01)

(58) Field of Classification Search
CPC ............. H01L 51/5056; H01L 51/5206; H01L 51/5221; H01L 27/3246; H01L 27/3258; H01L 27/3283; H01L 27/3295
See application file for complete search history.

(56) References Cited

U.S. PATENT DOCUMENTS

| 8,736,520 | B2 | 5/2014 | Koyama et al. |
| 2017/0154930 | A1* | 6/2017 | Kim ................... G02B 5/201 |
| 2017/0271421 | A1* | 9/2017 | Jinbo ................ H01L 51/5253 |
| 2018/0061907 | A1 | 3/2018 | Kim et al. |
| 2020/0106048 | A1* | 4/2020 | Xu ..................... H01L 27/3246 |

FOREIGN PATENT DOCUMENTS

| JP | 2001-222255 A | 8/2001 |
| JP | 2003-332069 A | 11/2003 |
| JP | 2005-141960 A | 6/2005 |

* cited by examiner

*Primary Examiner* — Matthew E. Gordon
(74) *Attorney, Agent, or Firm* — Birch, Stewart, Kolasch & Birch, LLP

(57) ABSTRACT

An electroluminescent display apparatus can include a substrate including a first subpixel and a second subpixel, a planarization layer on the substrate, a first electrode in each of the first subpixel and the second subpixel on the planarization layer, a bank between the first electrode of the first subpixel and the first electrode of the second subpixel, a light emitting layer on the first electrode and the bank, and a second electrode on the light emitting layer. The planarization layer includes a plurality of grooves in a region overlapping the bank, the bank includes a bank hole in a region overlapping some of the plurality of grooves, and the bank hole extends along a boundary between the first subpixel and the second subpixel.

18 Claims, 11 Drawing Sheets

ELECTROLUMINESCENT DISPLAY APPARATUS INCLUDING PLURALITY OF GROOVES OVERLAPPING BANK HOLE BETWEEN ADJACENT SUBPIXELS

CROSS-REFERENCE TO RELATED APPLICATIONS

This application claims the priority benefit of the Korean Patent Application No. 10-2018-0133246 filed in the Republic of Korea on Nov. 2, 2018, which is hereby incorporated by reference as if fully set forth herein.

BACKGROUND

Field of the Invention

The present disclosure relates to an electroluminescent display apparatus, and more particularly, to an electroluminescent display apparatus for emitting white light.

Discussion of the Related Art

Electroluminescent display apparatuses are apparatuses where a light emitting layer is provided between two electrodes (i.e., an anode electrode and a cathode electrode) and emits light with an electric field generated between the two electrodes, thereby displaying an image.

The light emitting layer may be formed of an organic material or an inorganic material such as a quantum dot. In the light emitting layer, an exciton is generated by a combination of an electron and a hole, and when the exciton is shifted from an excited state to a ground state, light is emitted.

The light emitting layer may emit lights of different colors (for example, red, green, and blue) in subpixels and may emit lights of the same color (for example, white light) in the subpixels.

In a case where the light emitting layer emit lights of different colors by units of subpixels, since different light emitting layers should be deposited in subpixels by using a mask, there is a limitation where a mask process is additionally performed. In this case, if a mask is not precisely aligned, there is a problem where it is difficult to deposit the light emitting layer in each subpixel.

On the other hand, in a case where the light emitting layer emits lights of the same color (for example, white light) in subpixels, a mask for forming a pattern of the light emitting layer is not needed, and thus, the problem caused by the mask process does not occur.

However, in the case which forms the light emitting layer emitting light of the same color for each subpixel without the mask process, an electric charge moves through the light emitting layer between subpixels adjacent to each other, and due to this, a leakage current occurs, causing the degradation in image quality.

SUMMARY

Accordingly, the present disclosure is directed to providing an electroluminescent display apparatus that substantially obviates one or more problems due to limitations and disadvantages of the related art.

An aspect of the present disclosure is directed to providing an electroluminescent display apparatus for decreasing the degradation in image quality caused by a leakage current.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided an electroluminescent display apparatus including a substrate including a first subpixel and a second subpixel, a planarization layer on the substrate, a first electrode in each of the first subpixel and the second subpixel on the planarization layer, a bank between the first electrode of the first subpixel and the first electrode of the second subpixel, a light emitting layer on the first electrode and the bank, and a second electrode on the light emitting layer, wherein the planarization layer includes a plurality of grooves in a region overlapping the bank, the bank includes a bank hole in a region overlapping some of the plurality of grooves, and the bank hole extends along a boundary between the first subpixel and the second subpixel.

In another aspect of the present disclosure, there is provided an electroluminescent display apparatus including a substrate including a first subpixel and a second subpixel, a bank area where a bank provided in a boundary between the first subpixel and the second subpixel is provided, an emission area defined by the bank area and provided in each of the first subpixel and the second subpixel, a bank hole area where a bank hole extending along the boundary between the first subpixel and the second subpixel and passing through the bank is provided, and a groove formation area overlapping the bank hole area under the bank hole area and comprising a plurality of grooves.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION OF THE DISCLOSURE

Figure 1:
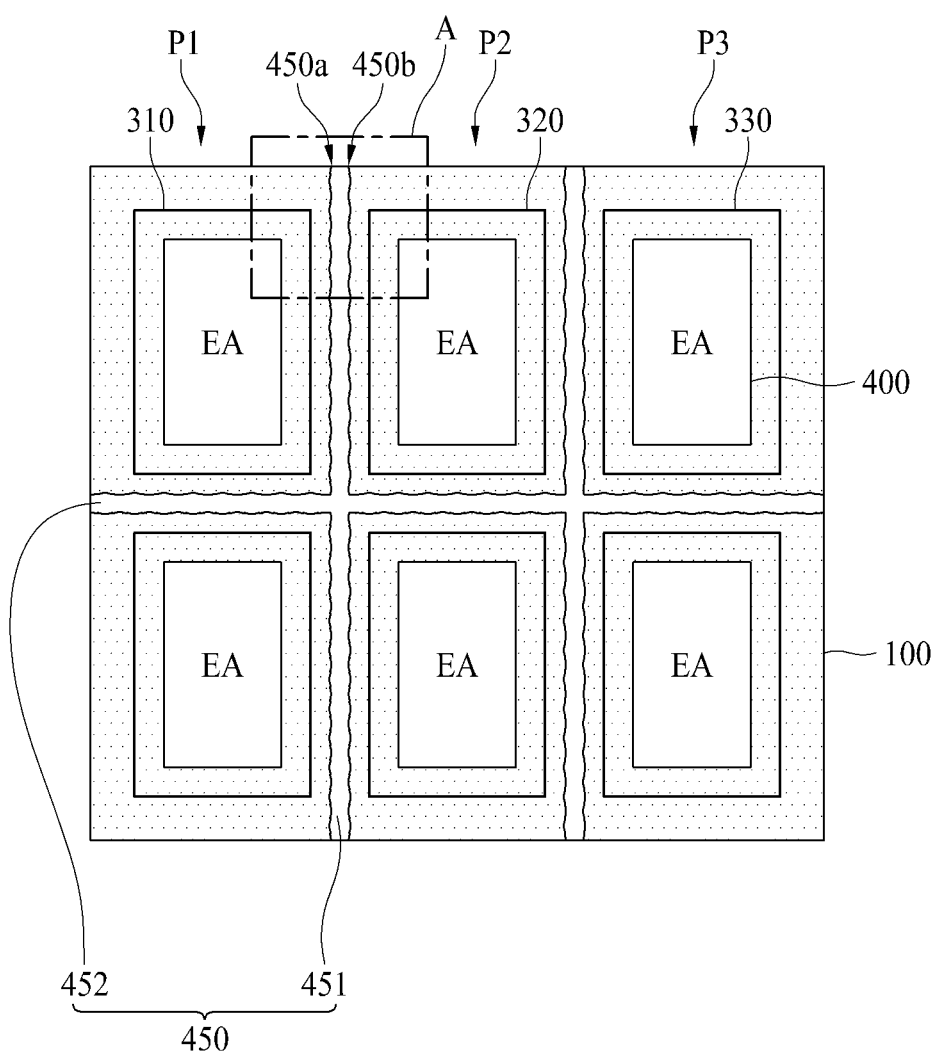
FIG. 1 is a schematic plan view of an electroluminescent display apparatus according to an embodiment of the present disclosure.

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In construing an element, the element is construed as including an error range although there is no explicit description.

In describing a position relationship, for example, when a position relation between two parts is described as 'on', 'over', 'under', and 'next', one or more other parts may be disposed between the two parts unless 'just' or 'direct' is used.

In describing a time relationship, for example, when the temporal order is described as 'after', 'subsequent', 'next', and 'before', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, exemplary embodiments of the present disclosure will be described in detail with reference to the accompanying drawings.

FIG. 1 is a schematic plan view of an electroluminescent display apparatus according to an embodiment of the present disclosure. All components of the electroluminescent display apparatus according to all embodiments of the present disclosure are operatively coupled and configured.

As seen in FIG. 1, the electroluminescent display apparatus according to the embodiment of the present disclosure can include a substrate 100, a plurality of first electrodes 310 to 330, and a bank 400.

A plurality of subpixels P1 to P3 can be provided in the substrate 100.

The plurality of subpixels P1 to P3 can include a first subpixel P1, a second subpixel P2, and a third subpixel P3. The first subpixel P1, the second subpixel P2, and the third subpixel P3 can be sequentially arranged in a widthwise direction, and thus, the first subpixel P1 and the second subpixel P2 can be disposed adjacent to each other and the second subpixel P2 and the third subpixel P3 can be disposed adjacent to each other. The first subpixel P1 can be provided to emit light having one color of red (R), green (G), and blue (B), the second subpixel P2 can be provided to emit light having another color of red (R), green (G), and blue (B), and the third subpixel P3 can be provided to emit light having the other color of red (R), green (G), and blue (B). However, other arrangements of colors are possible.

The subpixels P1 to P3 emitting lights of the same color can be arranged in one row in a lengthwise direction, but are not limited thereto. An arrangement structure of the plurality of subpixels P1 to P3 can be changed to various structures known to those skilled in the art.

The first electrodes 310 to 330 can be respectively patterned in the subpixels P1 to P3. For example, one first electrode 310 can be provided in the first subpixel P1, another first electrode 320 can be provided in the second subpixel P2, and another first electrode 330 can be provided in the third subpixel P3. Each of the first electrodes 310 to 330 can function as an anode of the electroluminescent display apparatus. The first electrodes 310 to 330 can be provided in a tetragonal structure, but are not limited thereto and can be modified into various structures known to those skilled in the art.

The bank 400 can be provided in a boundary region between the plurality of subpixels P1 to P3 to cover edges of the first electrodes 310 to 330. The bank 400 can be provided in the boundary region between the plurality of subpixels P1 to P3 which are vertically and horizontally adjacent to one another, and thus, can be wholly (entirely) provided in a matrix structure. An emission area EA can be defined in each of the plurality of subpixels P1 to P3 by the bank 400. That is, an exposure region, which is exposed without being covered by the bank 400, of each of the first electrodes 310 to 330 can configure the emission area EA.

A bank hole 450 can be provided in the bank 400. The bank hole 450 can be provided to vertically pass through a certain region of the bank 400. Therefore, a material forming the bank 400 may not be provided in a region of the bank hole 450, and a planarization layer provided under the bank 400 can be exposed in the region of the bank hole 450.

The bank hole 450 can be provided in the boundary region between the plurality of subpixels P1 to P3. Therefore, the bank hole 450 can be provided not to overlap the emission area EA, and particularly, can be provided not to overlap the first electrodes 310 to 330.

In detail, the bank hole 450 can extend along the boundary region between the plurality of subpixels P1 to P3 and can be wholly provided in a matrix structure similarly to the bank 400. Therefore, the bank hole 450 can include a first bank hole 451 extending in a first direction (for example, a vertical direction) and a second bank hole 452 extending in a second direction (for example, a horizontal direction). The first bank hole 451 can be provided between the first and second subpixels P1 and P2 adjacent to each other and between the second and third subpixels P2 and P3 adjacent to each other. Also, the second bank hole 452 can be provided between one first subpixel P1 and another first subpixel P1 adjacent to each other, between one second subpixel P2 and another second subpixel P2 adjacent to each other, and between one third subpixel P3 and another third subpixel P3 adjacent to each other.

A width of the bank hole 450 may not be constant. In detail, the bank hole 450 can include a region having a first width D1 and a region having a second width D2. The widths D1 and D2 of the bank hole 450 can denote a distance between an end of the bank hole 450 and an opposite end of the bank hole 450 in a direction perpendicular to an extension direction of the bank hole 450. Therefore, the first bank hole 451 extending in a vertical direction can have first and second widths D1 and D2 corresponding to a distance in a horizontal direction, and the second bank hole 452 extending in a horizontal direction can have first and second widths D1 and D2 corresponding to a distance in a vertical direction. In this case, the first and second widths D1 and D2 of the second bank hole 452 can be provided differently, based on positions. As seen in a below-described cross-sectional view, the widths D1 and D2 of the bank hole 450 in a plan view can correspond to widths D1 and D2 of an inlet of the bank hole 450 provided in an upper surface of the bank 400.

In detail, the widths D1 and D2 of the bank hole 450 can include a first width D1 which is relatively large and a second width D2 which is relatively small. Also, the bank hole 450 can include a region of which a width is reduced progressively in a direction from the first width D1 to the second width D2. Particularly, one end 450a and the other end 450b of the bank hole 450 defining the widths D1 and D2 of the bank hole 450 can be provided to each have a wave pattern structure or a moire pattern structure in the extension direction of the bank hole 450, and thus, the bank hole 450 can extend along a boundary between the subpixels P1 to P3 to have the wave pattern structure or the moire pattern structure where a shape where a width thereof increases progressively and then decreases progressively is repeated. In this case, a width of the bank hole 450 at a position at which the one end 450a and the other end 450b of the bank hole 450 are closest to each other can be the second width D2, and at a position at which the one end 450a and the other end 450b of the bank hole 450 are farthest away from each other, a width of the bank hole 450 can be the first width D1.

The bank hole 450 can prevent a leakage current from occurring between the subpixels P1 to P3 adjacent to one another. In a case where an interval between the subpixels P1 to P3 is very short for realizing a high resolution, when light is emitted from a light emitting layer in one of the subpixels P1 to P3, there is a possibility that an electric charge in the light emitting layer can move to an adjacent subpixel to cause a leakage current.

Therefore, in an embodiment of the present disclosure, the bank hole 450 can be provided in a boundary between the subpixels P1 to P3, and thus, a portion of the light emitting layer can be disconnected in a region overlapping the bank hole 450, thereby preventing a leakage current from occurring between the subpixels P1 to P3 adjacent to one another.

Figure 2:
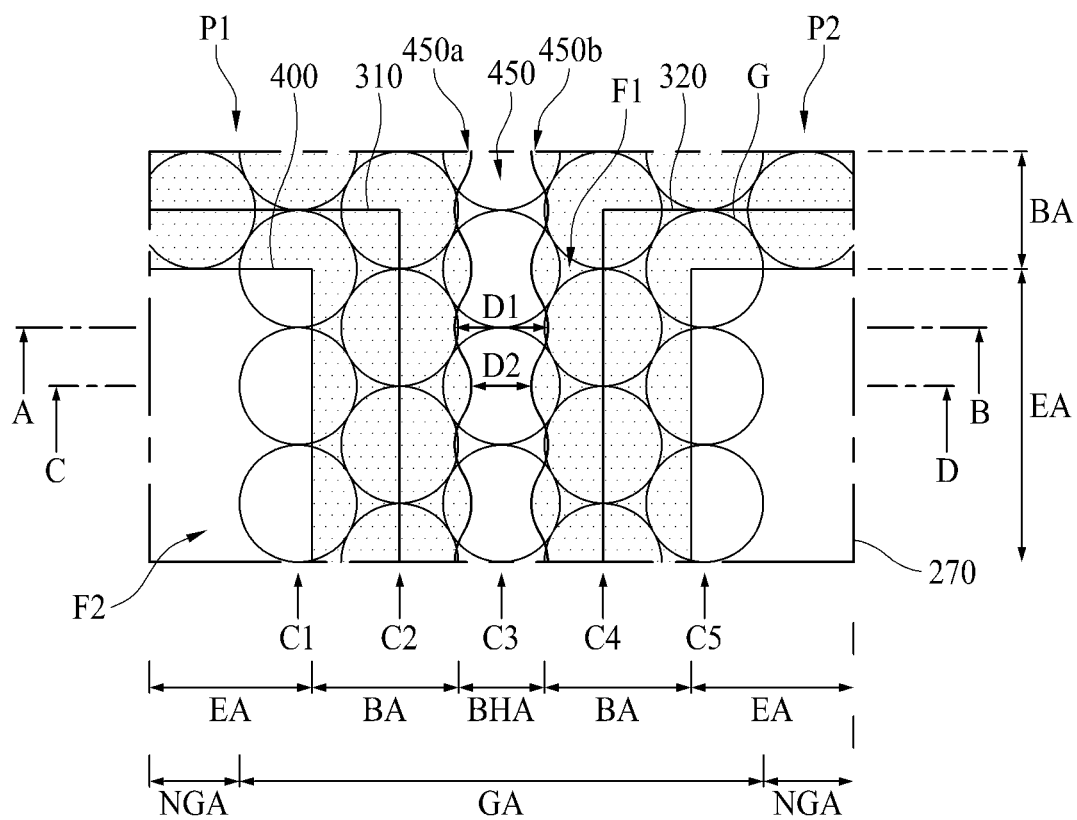
FIG. 2 is an enlarged view of a region A of FIG. 1 and illustrates an example where a planarization layer is additionally provided in FIG. 1.

FIG. 2 is an enlarged view of a region A of FIG. 1 and illustrates an example where a planarization layer 270 is additionally provided in FIG. 1.

Referring to FIG. 2, one first electrode 310 can be provided in a first subpixel P1, another first electrode 320 can be provided in a second subpixel P2, a bank 400 can be provided in a boundary region between the first subpixel P1 and the second subpixel P2 to cover edges of the first electrodes 310 and 320, and a bank hole 450 can be provided in the bank 400.

A region, which is exposed without being covered by the bank 400, of each of the first electrodes 310 and 320 can be an emission area EA. A region where the bank 400 is provided can be a bank area BA. A region where the bank 400 is not provided between the one first electrode 310 and the another first electrode 320 adjacent to each other can be a bank hole area BHA.

A planarization layer 270 can be provided under the first electrodes 310 and 320 and the bank 400. The planarization layer 270 can include a groove formation area GA and a groove non-formation area NGA.

The groove formation area GA can overlap the bank area BA and the bank hole area BHA and can partially overlap the emission area EA. A plurality of grooves G can be provided in an upper surface of the planarization layer 270 in the groove formation area GA.

The plurality of grooves G can be provided in a concave pattern in the upper surface of the planarization layer 270 without passing through the planarization layer 270 in a vertical direction. The plurality of grooves G can be provided in a circular shape in a plan view, but is not limited thereto and can be provided in an oval shape. Depending on the case, the plurality of grooves G can be provided in a polygonal structure in a plan view.

A plurality of first flat surfaces F1 where the upper surface of the planarization layer 270 is flat can be provided between the plurality of grooves G. Therefore, the plurality of grooves G and the plurality of first flat surfaces F1 can be provided in the groove formation area GA.

The plurality of grooves G can be disposed to have the form of a plurality of columns C1 to C5 arranged in a direction perpendicular to an extension direction of the bank hole 450. A plurality of grooves G can be arranged in one row in each of the columns C1 to C5. The plurality of grooves G arranged in each of the columns C1 to C5 can be arranged adjacent to one another, but are not limited thereto.

The groove formation area GA can overlap the bank hole 450, and some of the plurality of grooves G and some of the plurality of first flat surfaces F1 can be located in the groove formation area GA overlapping the bank hole 450. In this case, a height of each of the plurality of first flat surfaces F1 can be higher than that of each of the plurality of grooves G, and thus, a void can be formed to be deeper in the plurality of grooves G region than the plurality of first flat surfaces F1. This can be more easily understood with reference to a below-described cross-sectional view. In a case where a deep void is provided in a region overlapping the bank hole 450, at least a portion of the light emitting layer can be more easily disconnected. Therefore, a deep void provided in the region overlapping the bank hole 450 can be formed more easily in a case, where the plurality of grooves G overlap, than a case where the plurality of grooves G are spaced apart from one another, but is not limited thereto. Likewise, an area of the plurality of grooves G can be wider than that of first flat surface F1 in the groove formation area GA.

According to an embodiment, the plurality of grooves G can be arranged in a staggered arrangement structure between the plurality of columns C1 to C5. For example, the plurality of grooves G can be arranged in one row in a lengthwise direction which is the same as the extension direction of the bank hole 450, but may not be arranged in one row and can be arranged in zigzag in a widthwise direction perpendicular to the extension direction of the bank hole 450. Therefore, one groove G provided in one of the columns C1 to C5 can contact two of a plurality of grooves G provided in another column adjacent thereto.

As described above, in a case where the plurality of grooves G are arranged in a staggered arrangement structure between the plurality of columns C1 to C5, the first flat surfaces F1 and the grooves G can be alternately arranged in each of line A-B and line C-D, and thus, a deep void can be formed in the region overlapping the bank hole 450, whereby at least a portion of the light emitting layer can be easily disconnected. This can be easily understood with reference to a below-described cross-sectional view.

The groove non-formation area NGA can overlap the emission area EA. In the groove non-formation area NGA, the upper surface of the planarization layer 270 can include a second flat surface F2 which is flat. However, the whole upper surface of the planarization layer 270 may not be flat in the groove non-formation area NGA, a contact hole for connecting each of the first and second electrodes 310 and 320 to a driving thin film transistor (TFT) can be provided in the groove non-formation area NGA, and the upper surface of the planarization layer 270 can be provided not to have a flat structure in the contact hole region. The contact hole can pass through the planarization layer 270 in a vertical direction and can expose a source electrode or a drain electrode of the driving TFT provided under the planarization layer 270.

Hereinafter, an electroluminescent display apparatus according to an embodiment of the present disclosure will be described in more detail with reference to a cross-sectional structure.

Figure 3:
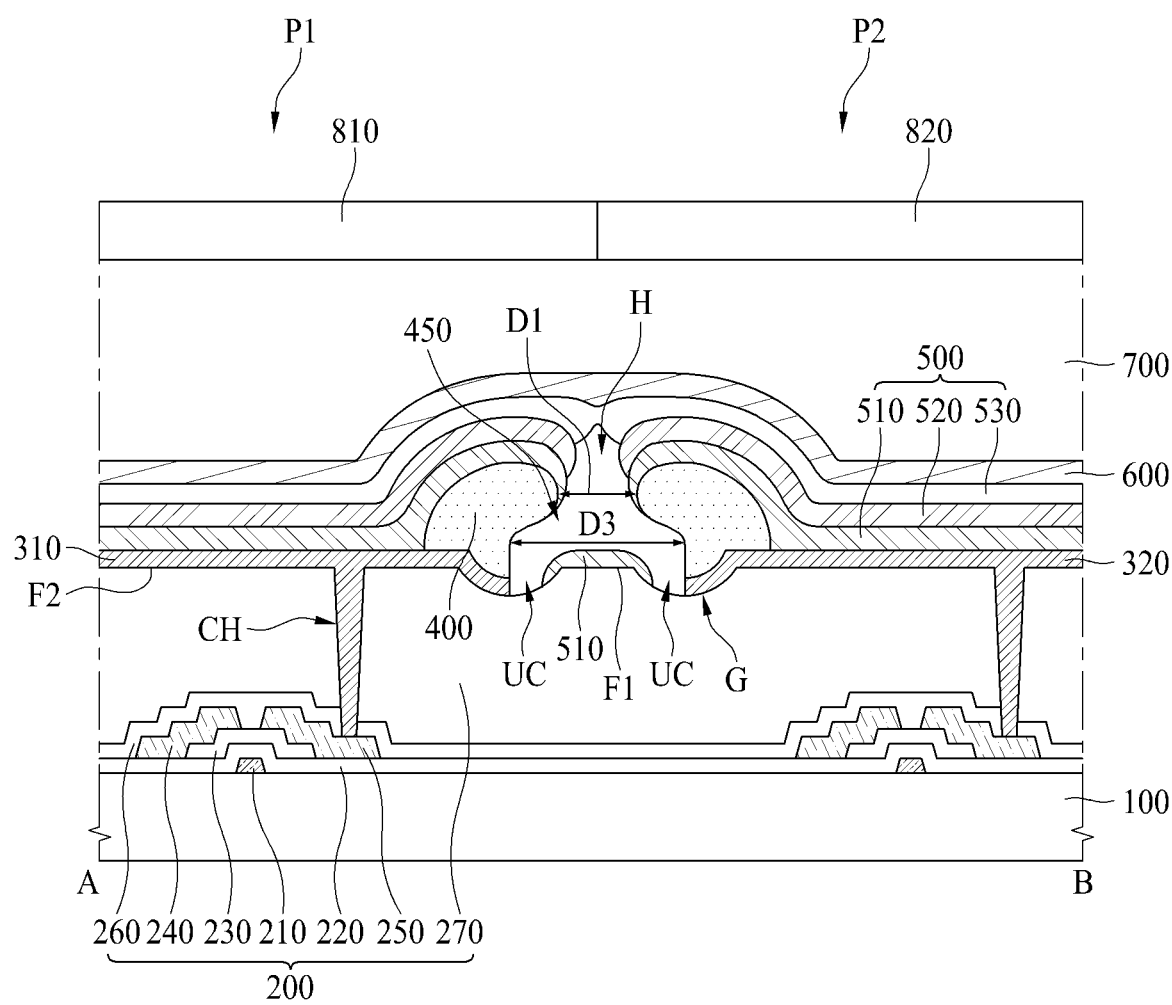
FIG. 3 is a schematic cross-sectional view of an electroluminescent display apparatus according to an embodiment of the present disclosure and is a cross-sectional view taken along line A-B of FIG. 2.

FIG. 3 is a schematic cross-sectional view of an electroluminescent display apparatus according to an embodiment of the present disclosure and is a cross-sectional view taken along line A-B of FIG. 2.

As seen in FIG. 3, the electroluminescent display apparatus according to the embodiment of the present disclosure can include a substrate 100, a circuit device layer 200, a plurality of first electrodes 310 and 320, a bank 400, a light emitting layer 500, a second electrode 600, an encapsulation layer 700, and a plurality of color filter layers 810 and 820.

The substrate 100 can be formed of glass or plastic, but is not limited thereto and can be formed of a semiconductor material such as a silicon wafer. The substrate 100 can be formed of a transparent material or an opaque material. A first subpixel P1 and a second subpixel P2 can be provided in the substrate 100.

The electroluminescent display apparatus according to an embodiment of the present disclosure can be implemented as a top emission type where emitted light is discharged to an upper portion. Accordingly, a material of the substrate 100 can use an opaque material as well as a transparent material.

The circuit device layer 200 can be provided on the substrate 100.

A circuit device including various signal lines, a TFT, a capacitor, and the like can be provided in the circuit device layer 200 in each of the first and second subpixels P1 and P2.

The signal lines can include a gate line, a data line, a power line, and a reference line, and the TFT can include a switching TFT, a driving TFT, and a sensing TFT.

The switching TFT can be turned on according to a gate signal supplied through the gate line and can transfer a data voltage, supplied through the data line, to the driving TFT.

The driving TFT can be turned on with the data voltage supplied through the switching TFT and can generate a data current from power supplied through the power line to supply the data current to the first electrodes 310 and 320.

The sensing TFT can sense a threshold voltage deviation of the driving TFT which causes the degradation in image quality and can supply a current of the driving TFT to the reference line in response to a sensing control signal supplied through the gate line or a separate sensing line.

The capacitor can hold the data voltage supplied to the driving TFT during one frame and can be connected to a gate terminal and a source terminal of the driving TFT.

Each of the switch TFT, the driving TFT, and the sensing TFT can include a gate electrode 210 provided on the substrate 100, a gate insulation layer 220 provided on the gate electrode 210, a semiconductor layer 230 provided on the gate insulation layer 220, and a source electrode 240 and a drain electrode 250 which are provided to face each other on the semiconductor layer 230. Each of the switch TFT, the driving TFT, and the sensing TFT can be provided in a top gate structure in addition to a bottom gate structure, but is not limited thereto and can be changed to various structures known to those skilled in the art.

The circuit device layer 200 can further include a passivation layer 260, provided on the source electrode 240 and the drain electrode 250, and a planarization layer 270 provided on the passivation layer 260. The passivation layer 260 can protect the switch TFT, the driving TFT, and the sensing TFT and can be formed of an inorganic insulating material, but is not limited thereto. The planarization layer 270 can planarize an upper surface of the substrate 100 and can be formed of an organic insulating material, but is not limited thereto.

A plurality of grooves G can be provided in an upper surface of the planarization layer 270, and a first flat surface F1 can be provided in a region between the plurality of grooves G. The plurality of grooves G can be provided in a concave lens shape. Also, a second flat surface F2 can be provided in the upper surface of the planarization layer 270 overlapping an emission area EA. The first flat surface F1 and the second flat surface F2 can be provided to have the same height. The plurality of grooves G provided in the planarization layer 270 can be formed through various patterning processes known to those skilled in the art like a photolithography process using exposure and development.

The first electrodes 310 and 320 can be patterned on the circuit device layer 200, and in more detail, can be patterned in each of the first and second subpixels P1 and P2 on the planarization layer 270. A portion of each of the first electrodes 310 and 320 can extend to an inner portion of one groove G provided in the upper surface of the planarization layer 270. That is, a portion of each of the first electrodes 310 and 320 can overlap some of the plurality of grooves G provided in the upper surface of the planarization layer 270. The first electrode 310 provided in the first subpixel P1 and the first electrode 320 provided in the second subpixel P2 can be spaced apart from each other, and particularly, can be spaced apart from each other with the first flat surface F1 provided in the upper surface of the planarization layer 270 therebetween.

The first electrodes 310 and 320 can be connected to the driving TFT provided in the circuit device layer 200. In detail, the first electrodes 310 and 320 can be connected to the drain electrode 250 of the driving TFT through a contact hole CH1 provided in the passivation layer 260 and the planarization layer 270. However, the first electrodes 310 and 320 can be connected to the source electrode 240 of the driving TFT through the contact hole CH1 provided in the passivation layer 260 and the planarization layer 270. The contact hole CH1 can be provided to pass through the passivation layer 260 and the planarization layer 270 and can expose the source electrode 240 or the drain electrode 250 of the driving TFT.

The bank 400 can be provided on the first electrodes 310 and 320. Particularly, the bank 400 can be provided to cover an upper surface of an end of each of the first electrodes 310 and 320, and a side surface of the end of each of the first electrodes 310 and 320 can be exposed without being covered by the bank 400. However, the present disclosure is not limited thereto, and the side surface of the end of each of the first electrodes 310 and 320 can be covered by the bank 400.

A bank hole 450 can be provided in the bank 400, and the first flat surface F1 and the plurality of grooves G of the planarization layer 270 can be located in a lower portion of the bank hole 450.

An inlet of the bank hole 450 can have a first width D1, an inner portion of the bank hole 450 extending in a downward direction from the inlet of the bank hole 450 having the first width D1 can have a third width D3, and the third width D3 can be greater than the first width D1. The bank hole 450 can be formed through a process of exposing and etching a certain region of the bank 400. In this case, an unexposed region can occur in a lower portion of the bank 400, and due to this, a lower portion of one side of the bank 400 contacting the bank hole 450 can be over-etched to cause an undercut UC. Since the undercut UC occurs, the third width D3 of an inner portion of the bank hole 450 can be greater than the first width D1 of the inlet of the bank hole 450. Also, since the third width D3 of the inner portion of the bank hole 450 is greater than the first width D1 of the inlet of the bank hole 450, the plurality of grooves G can be exposed at the inner portion of the bank hole 450, and thus, a depth of the bank hole 450 can be more deepened, whereby at least a portion of the light emitting layer 500 can be more easily disconnected in a region overlapping the bank hole 450. In order to implement the undercut UC structure by forming an unexposed region in a lower portion of the bank 400, the bank 400 can include a light-absorbing material (for example, a black material), but is not limited thereto.

The light emitting layer 500 can be provided on the first electrodes 310 and 320 and the bank 400. The light emitting layer 500 can be provided in a boundary region between the plurality of subpixels P1 and P2. That is, the light emitting layer 500 can be provided in the emission area EA and overlap the bank area BA.

The light emitting layer 500 can be provided to emit white (W) light. To this end, the light emitting layer 500 can include a plurality of stacks which emit lights of different colors. In detail, the light emitting layer 500 can include a first stack 510, a second stack 530, and a charge generating layer (CGL) 520 provided between the first stack 510 and the second stack 530.

The light emitting layer 500 can be provided in the bank hole 450 and above the bank hole 450. According to an embodiment of the present disclosure, at least a portion of the light emitting layer 500 can be disconnected in the bank hole 450 or above the bank hole 450, and thus, a leakage current can be prevented from occurring between adjacent subpixels P1 and P2.

The first stack 510 can be provided in an inner side surface of the bank hole 450, and moreover, can be provided in an inner lower surface of the bank hole 450. Therefore, the first stack 510 can be provided on the first flat surface F1 of the planarization layer 270, and depending on the case, can be provided in the plurality of grooves G of the planarization layer 270. In this case, a portion of the first stack 510 provided in the inner side surface of the bank hole 450 can be disconnected from a portion of the first stack 510 provided in the inner lower surface of the bank hole 450. Therefore, a portion of the first stack 510 provided in an inner left surface of the bank hole 450 can be disconnected from a portion of the first stack 510 provided in an inner right surface of the bank hole 450. Accordingly, an electric charge may not move, through the first stack 510, between the subpixels P1 and P2 which are disposed adjacent to each other with the bank hole 450 therebetween.

Moreover, the charge generating layer 520 can be provided on the first stack 510 in the inner side surface of the bank hole 450, or can be provided on the first stack 510 above the bank hole 450 without extending to the inner portion of the bank hole 450. In this case, the charge generating layer 520 can be disconnected between the inner left surface of the bank hole 450 and the inner right surface of the bank hole 450 or between a left upper portion of the bank hole 450 and a right upper portion of the bank hole 450. Accordingly, an electric charge may not move, through the charge generating layer 520, between the subpixels P1 and P2 which are disposed adjacent to each other with the bank hole 450 therebetween.

Moreover, the second stack 530 can connect between the subpixels P1 and P2 which are disposed adjacent to each other with the bank hole 450 therebetween on the charge generating layer 520. Therefore, an electric charge can move, through the second stack 530, between the subpixels P1 and P2 which are disposed adjacent to each other with the bank hole 450 therebetween. However, the present disclosure is not limited thereto, and by appropriately adjusting a shape of the bank hole 450 and a deposition process performed on the light emitting layer 500, the second stack 530 can be disconnected between the subpixels P1 and P2 which are disposed adjacent to each other with the bank hole 450 therebetween. Particularly, only a portion of a lower portion of the second stack 530 (for example HTL of the second stack 530) adjacent to the charge generating layer 520 can be disconnected in a region between the subpixels P1 and P2.

A void H can be formed in the inner portion of the bank hole 450 and an upper region of the bank hole 450 by the first stack 510, the charge generating layer 520, and the second stack 530. The void H can be defined by the planarization layer 270, the bank 400, and the light emitting layer 500. The void H can include the bank hole 450 and can be provided to have a size which is greater than the bank hole 450. The void H can be provided in a boundary between the subpixel P1 and P2 disposed adjacent to each other.

The first stack 510 can be provided in a structure where a hole injecting layer (HIL), a hole transporting layer (HTL), and a blue (B) emitting layer (EML (B)) are sequentially stacked, but is not limited thereto.

The charge generating layer 520 can be provided between the first stack 510 and the second stack 530 and can provide an electric charge to the first stack 510 and the second stack 530. The charge generating layer 520 can include an N-type charge generating layer for providing an electron to the first stack 510 and a P-type charge generating layer for providing a hole to the second stack 520. The N-type charge generating layer can include a dopant which is a metal material.

The N-type charge generating layer configuring the charge generating layer 520 can include a metal material, and thus, the charge generating layer 520 can be higher in conductivity than the first stack 510 and the second stack 530. Therefore, the movement of an electric charge between the subpixels P1 and P2 disposed adjacent to each other can be performed through the charge generating layer 520, and the amount of electric charges moving through the second stack 530 can be very small. Accordingly, according to an embodiment of the present disclosure, the charge generating layer 520 can be disconnected in the region overlapping the bank hole 450, and thus, can block the movement of an electric charge between the subpixels P1 and P2 disposed adjacent to each other, thereby preventing the occurrence of a leakage current.

The second stack 520 can be provided on the charge generating layer 520 to have a structure where a hole transporting layer (HTL), a yellowish green (YG) emitting layer (EML (YG)), an electron transporting layer (ETL), and an electron injecting layer (EIL) are sequentially stacked, but is not limited thereto.

In the present disclosure, a stacked structure of the first stack 510 and the second stack 530 and a wavelength of light emitted from each of the first stack 510 and the second stack 530 can be changed to various structures known to those skilled in the art.

The second electrode 600 can be provided on the light emitting layer 500. The second electrode 600 can function as a cathode of the electroluminescent display apparatus. The second electrode 600 can be provided in each of the subpixels P1 and P2 and a boundary region therebetween.

Since the electroluminescent display apparatus according to an embodiment of the present disclosure is implemented as the top emission type, the second electrode 600 can include a transparent conductive material for transmitting light, emitted from the light emitting layer 500, toward an upper portion. Also, the second electrode 600 can be a semitransparent electrode, and thus, a micro-cavity effect can be obtained for each of the subpixels P1 and P2. When the second electrode 600 is a semitransparent electrode, reflection and re-reflection of light can be repeated between the second electrode 600 and the first electrodes 310 and 320, and thus, the micro-cavity effect can be obtained, thereby enhancing light efficiency.

The encapsulation layer 700 can be provided on the second electrode 600 and can prevent external water from penetrating into the light emitting layer 500. The encapsulation layer 700 can be formed of an inorganic insulating material or can be formed in a structure where an inorganic insulating material and an organic insulating material are alternately stacked, but is not limited thereto.

The color filter layers 810 and 820 can be provided on the encapsulation layer 700. The color filter layers 810 and 820 can include a first color filter 810 provided in the first subpixel P1 and a second color filter 820 provided in the second subpixel P2. Although not shown, a third subpixel can be disposed adjacent to the second subpixel P2, and a third color filter can be provided in the third subpixel. The first color filter 810 can be a color filter having one color of red, green, and blue, the second color filter 820 can be a color filter having another color of red, green, and blue, and the third color filter can be a color filter having the other color of red, green, and blue. Although not shown, a black matrix can be additionally provided between the color filter layers 810 and 820 and can prevent light from being leaked in a boundary between the subpixels P1 and P2.

Figure 4:
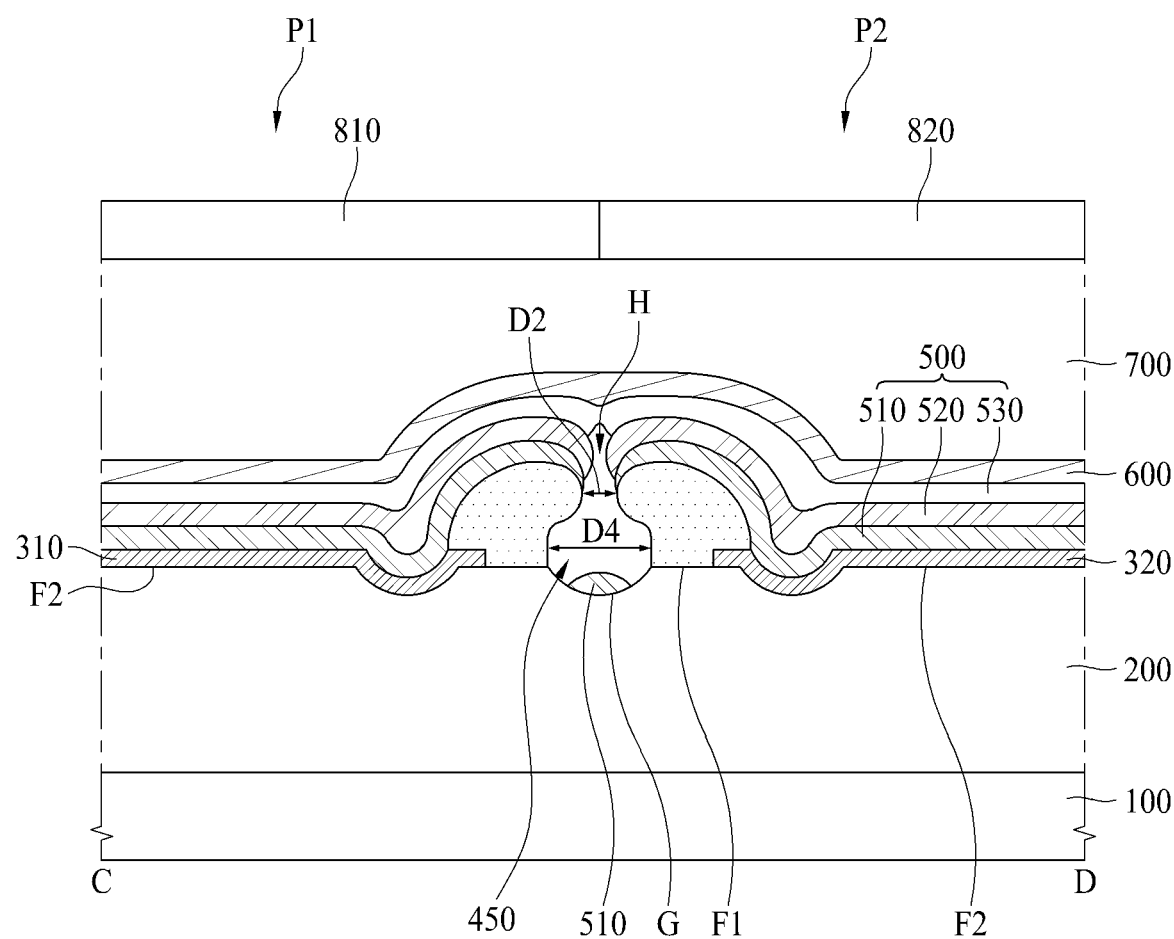
FIG. 4 is a schematic cross-sectional view of an electroluminescent display apparatus according to an embodiment of the present disclosure and is a cross-sectional view taken along line C-D of FIG. 2.

FIG. 4 is a schematic cross-sectional view of an electroluminescent display apparatus according to an embodiment of the present disclosure and is a cross-sectional view taken along line C-D of FIG. 2.

As seen in FIG. 4, a circuit device layer 200 can be provided on a substrate 100, a plurality of first electrodes 310 and 320 can be provided on the circuit device layer 200, a bank 400 can be provided on the first electrodes 310 and 320, a light emitting layer 500 can be provided on the first electrodes 310 and 320 and the bank 400, a second electrode 600 can be provided on the light emitting layer 500, an encapsulation layer 700 can be provided on the second electrode 600, and a plurality of color filter layers 810 and 820 can be provided on the encapsulation layer 700.

The circuit device layer 200 can be as described above with reference to FIG. 3, and thus, for convenience, a detailed configuration of the circuit device layer 200 is omitted in FIG. 4. In TFTs and circuit lines, a cross-sectional structure of the circuit device layer 200 in line C-D of FIG. 2 can differ from a cross-sectional structure of the circuit device layer 200 in line A-B of FIG. 2. In FIG. 4, a groove G and a first flat surface F1 can be alternately arranged in an upper surface of the circuit device layer 200 (i.e., an upper surface of a planarization layer 270).

A portion of each of the first electrodes 310 and 320 can extend to the groove G and a first flat surface F1 each provided in the upper surface of the circuit device layer 200, and the first electrode 310 provided in a first subpixel P1 and the first electrode 320 provided in a second subpixel P2 can be spaced apart from each other with the groove G therebetween.

The bank 400 can be provided to cover all of an upper surface and a side surface of an end of each of the first electrodes 310 and 320. Also, the groove G of the circuit device layer 200 can be located in a lower portion of the bank hole 450 provided in the bank 400, and thus, a depth of the bank hole 450 can be deepened, whereby at least a portion of the light emitting layer 500 can be more easily disconnected in a region overlapping the bank hole 450.

An inlet of the bank hole 450 can have a second width D2, an inner portion of the bank hole 450 extending in a downward direction from the inlet of the bank hole 450 having the second width D2 can have a fourth width D4, and the fourth width D4 can be greater than the second width D2. Similarly to the above description, this is because a lower portion of one side of the bank 400 contacting the bank hole 450 is over-etched to cause an undercut UC. Since the undercut UC occurs, the fourth width D4 of an inner portion of the bank hole 450 can be greater than the second width D2, and thus, at least a portion of the light emitting layer 500 can be more easily disconnected in a region overlapping the bank hole 450.

The light emitting layer 500 can be configured similar to the configuration of FIG. 3 described above.

In detail, the first stack 510 can be provided in a side surface and a lower surface of an inner portion of the bank hole 450, and thus, can be provided in the groove G of the planarization layer 270. In this case, a portion of the first stack 510 provided in an inner side surface of the bank hole 450 can be disconnected from a portion of the first stack 510 provided in an inner lower surface of the bank hole 450. Accordingly, an electric charge may not move, through the first stack 510, between the subpixels P1 and P2 which are disposed adjacent to each other with the bank hole 450 therebetween.

Moreover, a charge generating layer 520 can be disconnected between an inner left surface of the bank hole 450 and an inner right surface of the bank hole 450 or between a left upper portion of the bank hole 450 and a right upper portion of the bank hole 450. Accordingly, an electric charge may not move, through the charge generating layer 520, between the subpixels P1 and P2 which are disposed adjacent to each other with the bank hole 450 therebetween.

Moreover, the second stack 530 can connect between the subpixels P1 and P2 which are disposed adjacent to each other with the bank hole 450 therebetween on the charge generating layer 520, but is not limited thereto. In other embodiments, a portion of a lower portion of the second stack 530 adjacent to the charge generating layer 520 can be disconnected in a region between the subpixels P1 and P2.

The second electrode 600, the encapsulation layer 700, and the color filter layers 810 and 820 are as described above with reference to FIG. 3, and thus, their repetitive descriptions are omitted.

Figure 5:
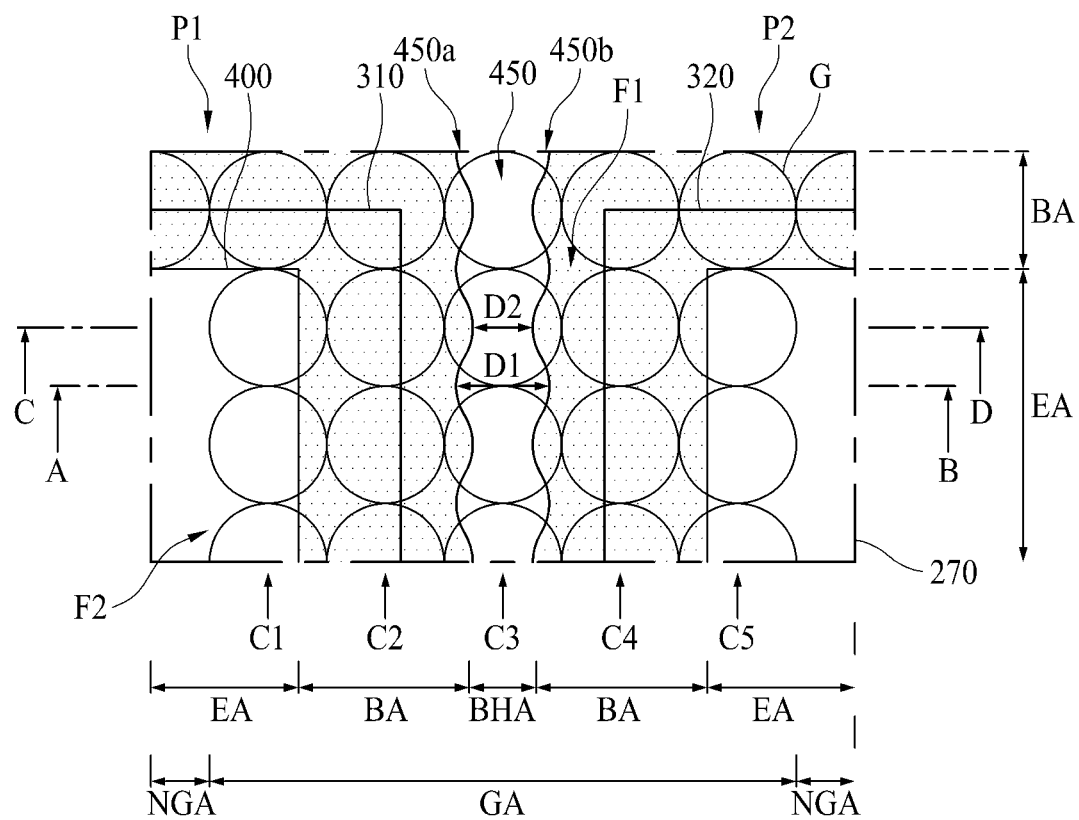
FIG. 5 is a schematic plan view of an electroluminescent display apparatus according to another embodiment of the present disclosure, corresponds to the region A of FIG. 1, and illustrates an example where a planarization layer is additionally provided in FIG. 1.

FIG. 5 is a schematic plan view of an electroluminescent display apparatus according to another embodiment of the present disclosure, corresponds to the region A of FIG. 1, and illustrates an example where a planarization layer 270 is additionally provided in FIG. 1.

Except for that a structure of a groove formation area GA of the planarization layer 270 is changed, the electroluminescent display apparatus of FIG. 5 is the same as the above-described electroluminescent display apparatus of FIG. 2. Therefore, like reference numerals refer to like elements. Hereinafter, to reduce redundancy, only different elements will be described.

As seen in FIG. 5, a plurality of grooves G and a plurality of first flat surfaces F1 can be provided in the groove formation area GA of the planarization layer 270, and the plurality of grooves G can be disposed to have the form of columns C1 to C5.

In this case, the plurality of grooves G can be provided in the same arrangement structure in each of the columns C1 to C5, and thus, the plurality of grooves G can be arranged in one row between the columns C1 to C5. For example, the plurality of grooves G can be arranged in one row in a lengthwise direction which is the same as an extension direction of a bank hole 450, or can be arranged in one row in a widthwise direction perpendicular to the extension direction of the bank hole 450. Therefore, one groove G provided in one of the columns C1 to C5 can contact one of a plurality of grooves G provided in another column adjacent thereto.

As described above, in a case where the plurality of grooves G are arranged in one row between the plurality of columns C1 to C5, a region overlapping the bank hole 450 in line A-B and a region overlapping the bank hole 450 in line C-D can be configured differently. This will be described below in detail with reference to cross-sectional views of FIGS. 6 and 7.

Figure 6:
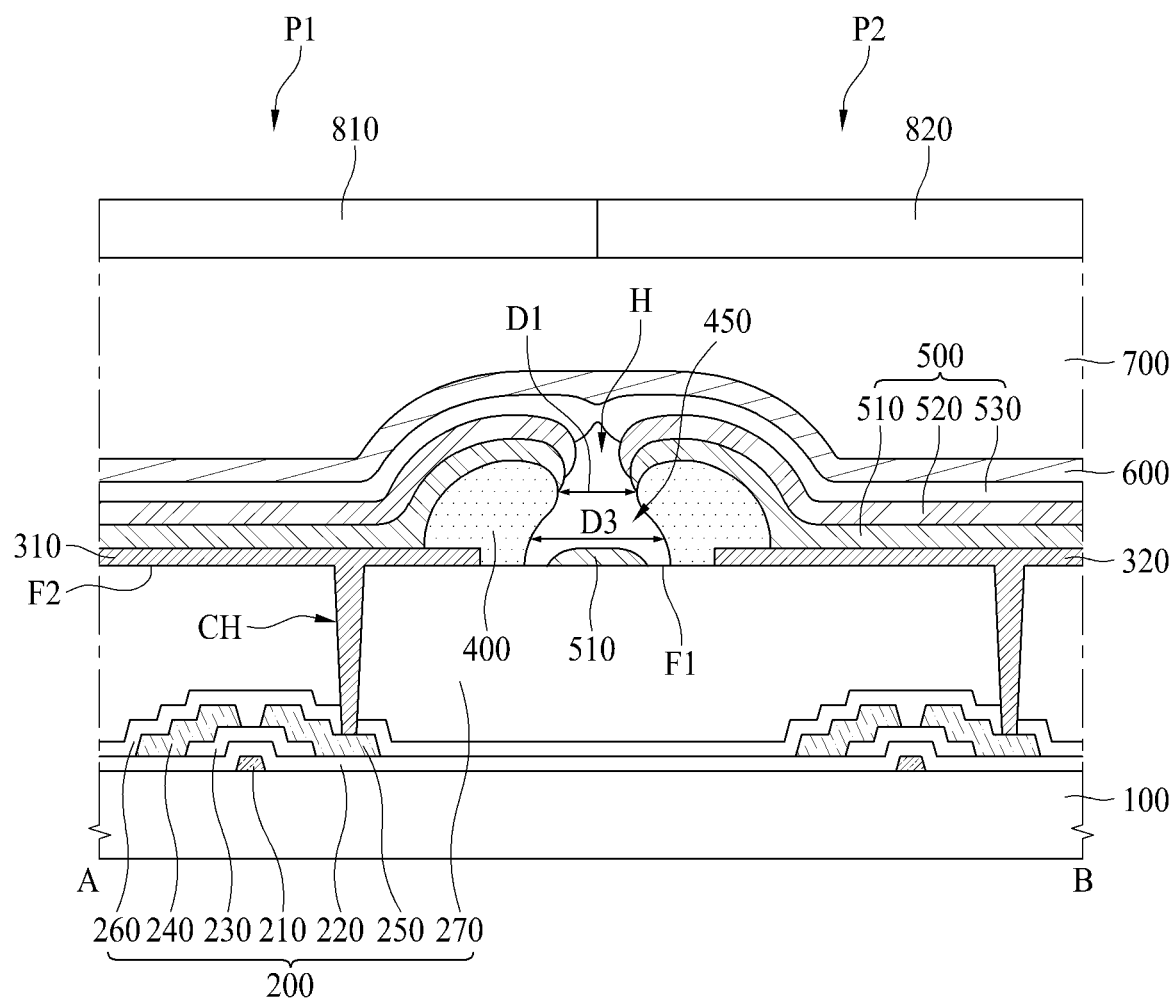
FIG. 6 is a schematic cross-sectional view of an electroluminescent display apparatus according to another embodiment of the present disclosure and is a cross-sectional view taken along line A-B of FIG. 5.

FIG. 6 is a schematic cross-sectional view of an electroluminescent display apparatus according to another embodiment of the present disclosure and is a cross-sectional view taken along line A-B of FIG. 5.

As seen in FIG. 6, the electroluminescent display apparatus according to another embodiment of the present disclosure can include a substrate 100, a circuit device layer 200, a plurality of first electrodes 310 and 320, a bank 400, a light emitting layer 500, a second electrode 600, an encapsulation layer 700, and a plurality of color filter layers 810 and 820.

The substrate 100, the second electrode 600, the encapsulation layer 700, and the color filter layers 810 and 820 are as described above with reference to FIG. 3, and thus, only different elements will be described below.

Except for a structure of a planarization layer 270, the circuit device layer 200 is the same as the illustration of FIG. 3 described above. A plurality of grooves G may not be provided in an upper surface of the planarization layer 270, and a first flat surface F1 overlapping the bank 400 and a second flat surface F2 overlapping an emission area EA can be provided in the upper surface of the planarization layer 270.

The first electrodes 310 and 320 can be provided in the upper surface of the planarization layer 270, and particularly, can be provided on the first flat surface F1 and the second flat surface F2.

The bank 400 can be provided to cover and upper surface and a side surface of an end of each of the first electrodes 310 and 320. The bank hole 450 can be provided in the bank 400, and the flat surface F1 of the planarization layer 270 can be extended to a lower portion of the bank hole 450.

An inlet of the bank hole 450 can have a first width D1, an inner portion of the bank hole 450 can have a third width D3, and the third width D3 can be greater than the first width D1. This is because a lower portion of one side of the bank 400 contacting the bank hole 450 is over-etched to cause an undercut UC.

Unlike FIG. 3, in FIG. 6, since the groove G is not located in the lower portion of the bank hole 450 and only the first flat surface F1 is located in the lower portion of the bank hole 450, a degree of over-etching can be reduced to decrease a size of the undercut UC, and thus, the third width D3 of FIG. 6 can be less than the third width D3 of FIG. 3. Also, in FIG. 6, since the groove G is not located in the lower portion of the bank hole 450, a depth of the bank hole 450 can be reduced compared to FIG. 3. Therefore, in order to more easily disconnect at least a portion of the light emitting layer 500 in a region overlapping the bank hole 450 by deepening a depth of the bank hole 450, a height of the bank 400 can increase compared to FIG. 3.

The light emitting layer 500 can be disconnected in the bank hole 450 or above the bank hole 450 like FIG. 3, and thus, a leakage current can be prevented from occurring between adjacent subpixels P1 and P2. That is, each of the first stack 510 and the charge generating layer 520 can be disconnected in a region overlapping the bank hole 450, and thus, an electric charge may not move, through the first stack 510 and the charge generating layer 520, between the subpixels P1 and P2 disposed adjacent to each other with the bank hole 450 therebetween. On the other hand, the second stack 530 can connect between the subpixels P1 and P2 disposed adjacent to each other with the bank hole 450 therebetween, but is not limited thereto. In other embodiments, a portion of a lower portion of the second stack 530 adjacent to the charge generating layer 520 can be disconnected between the subpixels P1 and P2.

Figure 7:
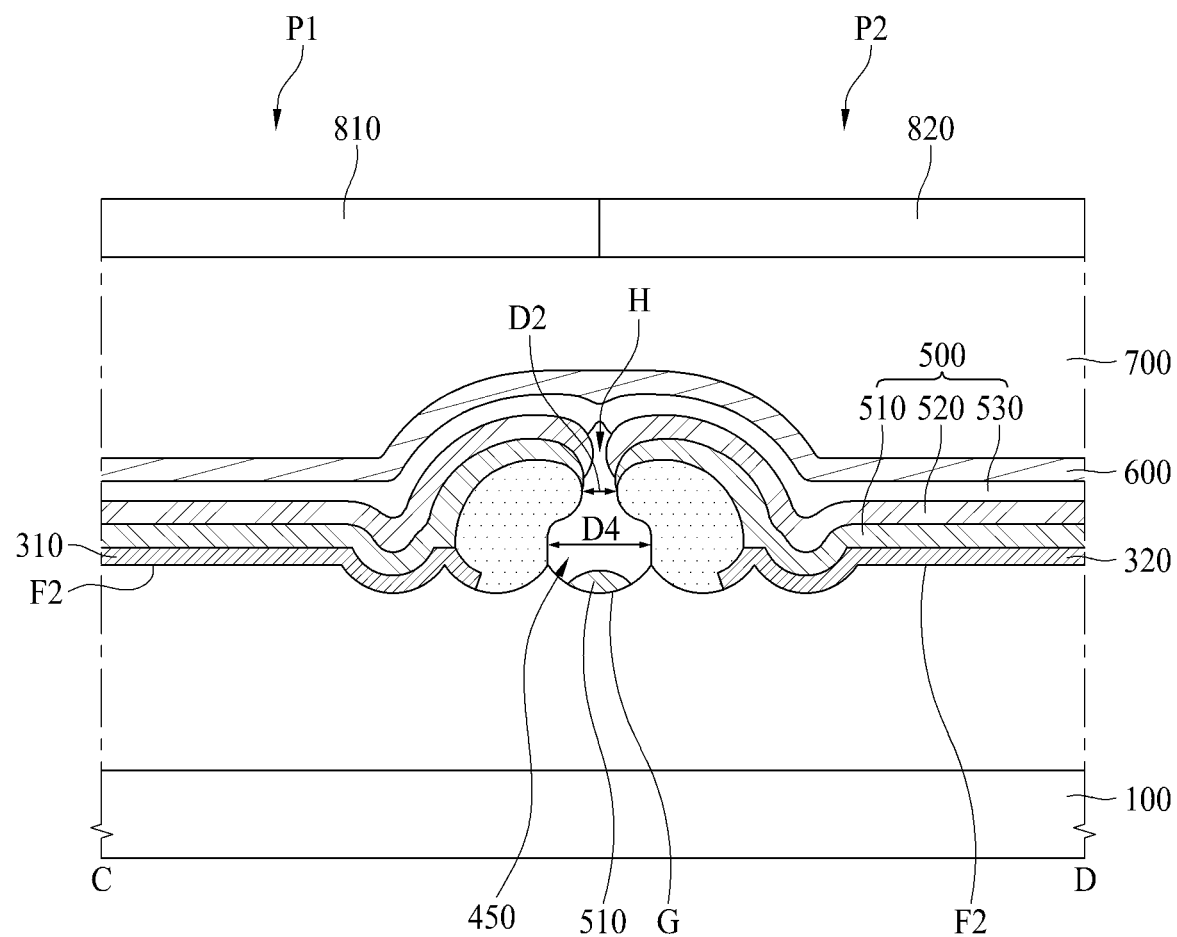
FIG. 7 is a schematic cross-sectional view of an electroluminescent display apparatus according to another embodiment of the present disclosure and is a cross-sectional view taken along line C-D of FIG. 5.

FIG. 7 is a schematic cross-sectional view of an electroluminescent display apparatus according to another embodiment of the present disclosure and is a cross-sectional view taken along line C-D of FIG. 5.

Except for that an upper surface of a circuit device layer 200 is modified and a structure of each of first and second electrodes 310 and 320 and a bank 400, FIG. 7 is the same as FIG. 4. Hereinafter, therefore, only the upper surface of the circuit device layer 200, the first and second electrodes 310 and 320, and the bank 400 will be described.

As seen in FIG. 7, a plurality of grooves G overlapping the bank 400 can be disposed adjacent to one another in the upper surface of the circuit device layer 200 (i.e., an upper surface of a planarization layer 270), and a second flat surface F2 overlapping an emission area EA can be provided in the upper surface of the circuit device layer 200.

Therefore, a portion of each of the first electrodes 310 and 320 can extend to the groove G provided in the upper surface of the circuit device layer 200, and the first electrode 310 provided in a first subpixel P1 and the first electrode 320 provided in a second subpixel P2 can be spaced apart from each other with the groove G therebetween.

The bank 400 can be provided to cover all of an upper surface and a side surface of an end of each of the first electrodes 310 and 320 and can be provided in the groove G of the circuit device layer 200. Also, the groove G of the circuit device layer 200 can be located in a lower portion of a bank hole 450 provided in the bank 400. In the drawing, an example where only one groove G is located in a lower portion of the bank hole 450 is illustrated, but a plurality of grooves G can be provided.

An inlet of the bank hole 450 can have a second width D2, an inner portion of the bank hole 450 can have a fourth width D4, and the fourth width D4 can be greater than the second width D2. Particularly, because the plurality of grooves G are arranged adjacent to one another under the bank hole 450, a size of an undercut UC can increase due to over-etching, and thus, the fourth width D4 of FIG. 7 can increase compared to the fourth width D4 of FIG. 4.

Figure 8:
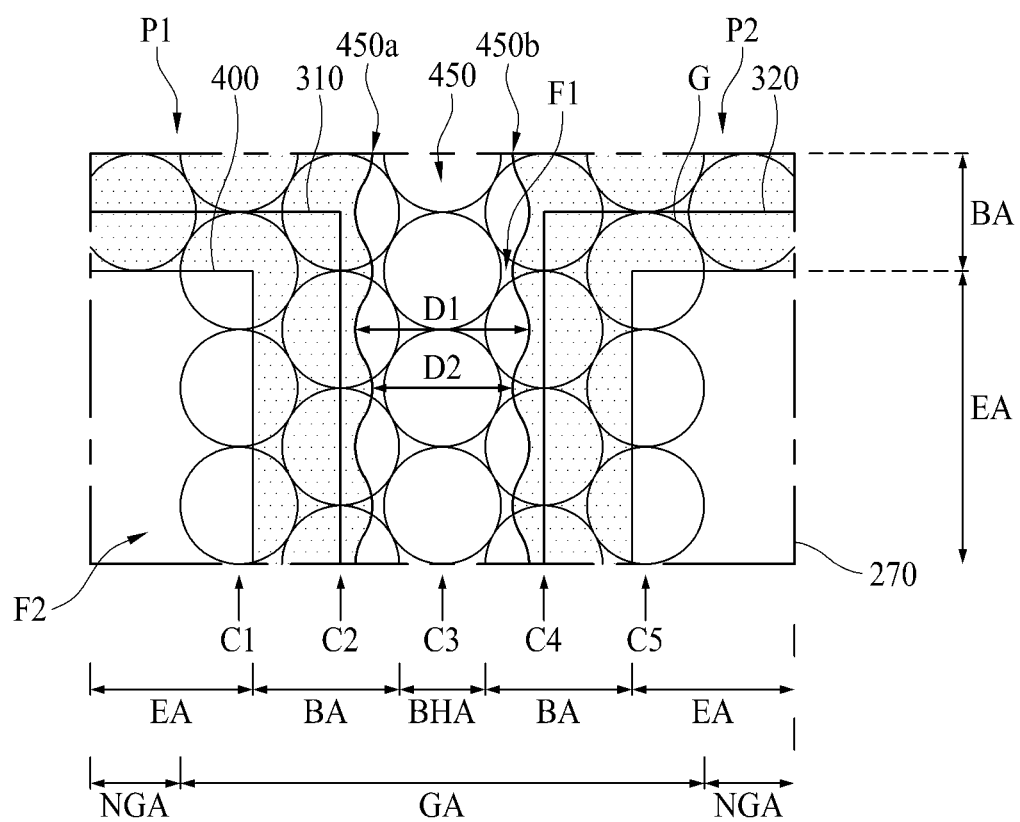
FIG. 8 is a schematic plan view of an electroluminescent display apparatus according to another embodiment of the present disclosure, corresponds to the region A of FIG. 1, and illustrates an example where a planarization layer is additionally provided in FIG. 1.

FIG. 8 is a schematic plan view of an electroluminescent display apparatus according to another embodiment of the present disclosure, corresponds to the region A of FIG. 1, and illustrates an example where a planarization layer 270 is additionally provided in FIG. 1.

Except for that a structure of a bank hole 450 is changed, the electroluminescent display apparatus of FIG. 8 is the same as the above-described electroluminescent display apparatus of FIG. 2. Therefore, like reference numerals refer to like elements. Hereinafter, only different elements will be described.

In FIG. 2, the bank hole 450 can be provided to overlap one column C3 among the columns C1 to C5 where the plurality of grooves G provided in the planarization layer 270 are arranged. On the other hand, in FIG. 8, a bank hole 450 can be provided to overlap some columns C2 to C4 among a plurality of columns C1 to C5 where a plurality of grooves G provided in a planarization layer 270 are arranged. Particularly, the bank hole 450 can wholly overlap one column C3 and can partially overlap other columns C2 and C4. Accordingly, widths D1 and D2 of the bank hole 450 of FIG. 8 can be provided to be greater than the widths D1 and D2 of the bank hole 450 of FIG. 2.

When each of the widths D1 and D2 of the bank hole 450 is too small, at least a portion of the light emitting layer 500 may not be disconnected in a region overlapping the bank hole 450, and due to this, a leakage current can occur. When each of the widths D1 and D2 of the bank hole 450 is too large, the second electrode 600 can be disconnected in a region overlapping the bank hole 450, and due to this, light may not be emitted from each of subpixels P1 to P2. Therefore, the widths D1 and D2 of the bank hole 450 can be adjusted so that at least a portion of the light emitting layer 500 is disconnected and the second electrode 600 is not disconnected in a region overlapping the bank hole 450, and considering this, each of the widths D1 and D2 of the bank hole 450 can be within a range of 0.1 um to 0.2 um. However, the present disclosure is not limited thereto.

In order for the bank hole 450 not to overlap the columns C2 to C4, a diameter of the groove G provided in the planarization layer 270 can be less than the first width D1 of the bank hole 450.

When the bank hole 450 is provided to overlap the columns C2 to C4, the groove G and a first flat surface F1 can be alternately arranged in the region overlapping the bank hole 450, and thus, at least a portion of the light emitting layer 500 can be effectively disconnected.

Figure 9:
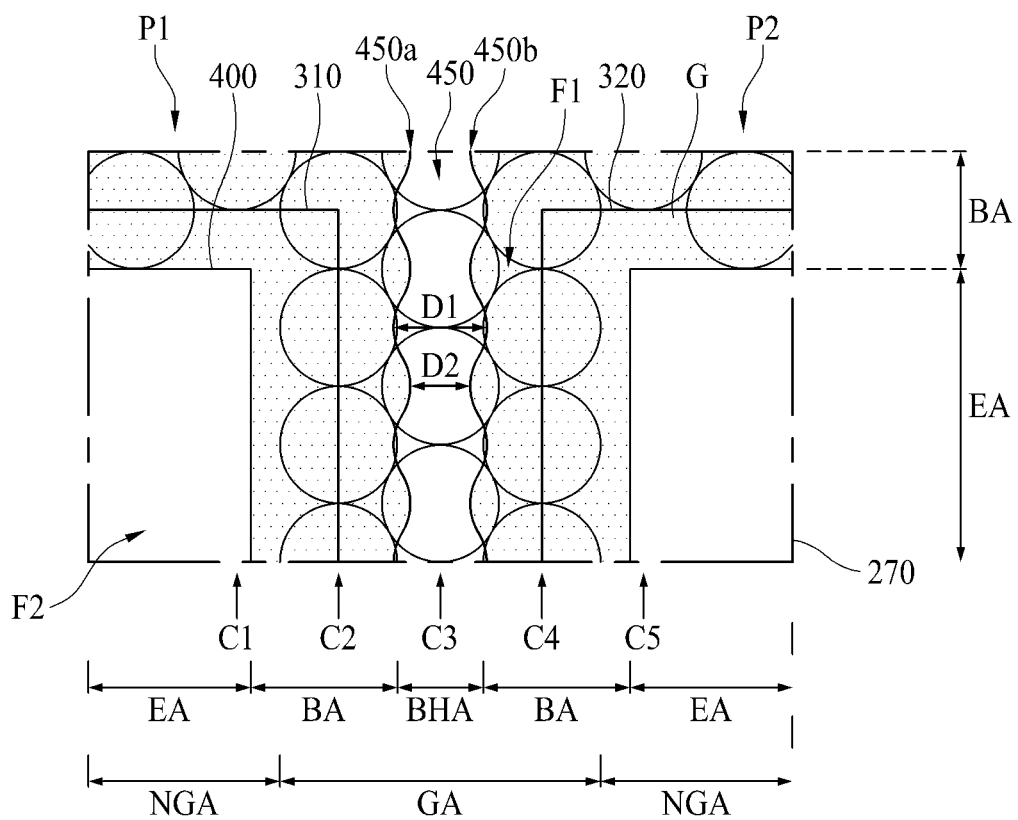
FIG. 9 is a schematic plan view of an electroluminescent display apparatus according to another embodiment of the present disclosure, corresponds to the region A of FIG. 1, and illustrates an example where a planarization layer is additionally provided in FIG. 1.

FIG. 9 is a schematic plan view of an electroluminescent display apparatus according to another embodiment of the present disclosure, corresponds to the region A of FIG. 1, and illustrates an example where a planarization layer 270 is additionally provided in FIG. 1.

Except for that an arrangement structure of a plurality of grooves G provided in the planarization layer 270 is changed, the electroluminescent display apparatus of FIG. 9 is the same as the above-described electroluminescent display apparatus of FIG. 2. Therefore, like reference numerals refer to like elements. Hereinafter, only different elements will be described.

In FIG. 2, the groove G provided in the planarization layer 270 can be provided to partially overlap the emission area EA. On the other hand, in FIG. 9, a groove G provided in the planarization layer 270 can be provided not to overlap an emission area EA. That is, a groove formation area GA can overlap a bank area BA and a bank hole area BHA but may not overlap the emission area EA, and a groove non-formation area NGA can overlap the emission area EA.

As described above, when the groove G is provided not to overlap the emission area EA, an upper surface of the planarization layer 270 provided in the emission area EA can be flat, and thus, a surface of a light emitting layer 500 can be uniform in the emission area EA.

Figure 10A:
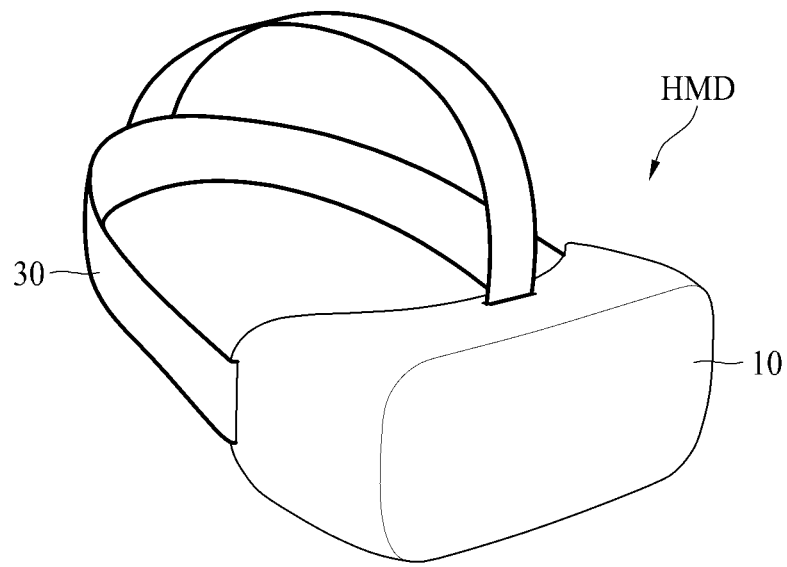
FIGS. 10A to 10C illustrate examples of devices including an electroluminescent display apparatus according to another embodiment of the present disclosure and relate to a head-mounted display (HMD) apparatus.
Figure 10B:
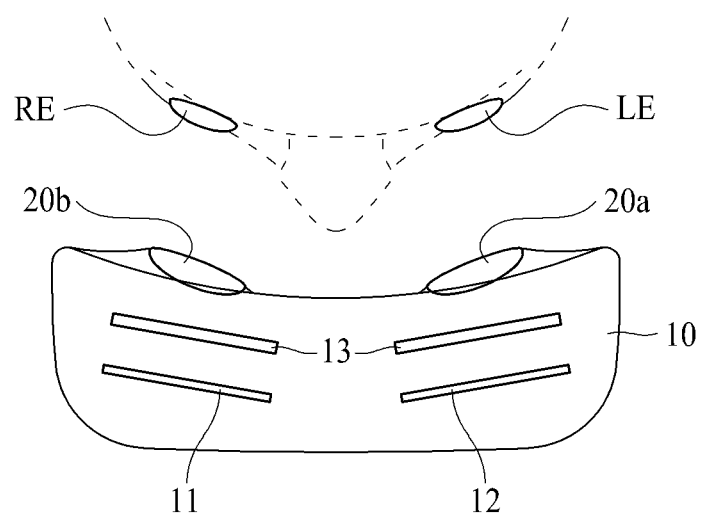
Figure 10C:
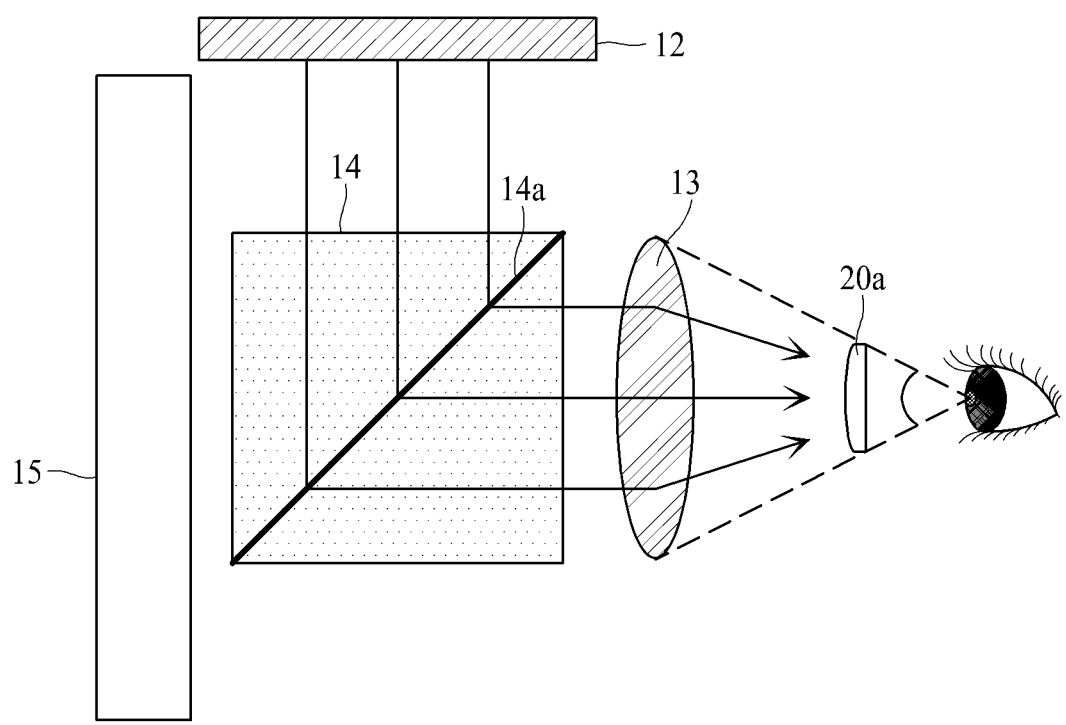

FIGS. 10A to 10C illustrate examples of devices including an electroluminescent display apparatus according to another embodiment of the present disclosure and relate to a head-mounted display (HMD) apparatus. More specifically, FIG. 10A is a schematic perspective view of a HMD, FIG. 10B is a schematic plan view of a virtual reality (VR) structure, and FIG. 10C is a schematic cross-sectional view of an augmented reality (AR) structure.

As seen in FIG. 10A, the HMD apparatus according to the present disclosure can include an accommodating case 10 and a head-mounted band 30.

The accommodating case 10 can accommodate elements such as a display apparatus, a lens array, and an eyepiece lens.

The head-mounted band 30 can be fixed to the accommodating case 10. The head-mounted band 30 is illustrated as being provided to surround an upper surface of both side surfaces of a user, but is not limited thereto. The head-mounted band 30 can fix the HMD apparatus to a head of a user and can be replaced by a glasses frame type structure or a helmet type structure.

As seen in FIG. 10B, an HMD apparatus having the VR structure according to the present disclosure can include a left-eye display apparatus 12, a right-eye display apparatus 11, a lens array 13, a left-eye eyepiece lens 20a, and a right-eye eyepiece lens 20b.

The left-eye display apparatus 12, the right-eye display apparatus 11, the lens array 13, the left-eye eyepiece lens 20a, and the right-eye eyepiece lens 20b can be accommodated into the accommodating case 10.

The left-eye display apparatus 12 and the right-eye display apparatus 11 can display the same image, and in this case, a user can watch a two-dimensional (2D) image. Alternatively, the left-eye display apparatus 12 can display a left-eye image, and the right-eye display apparatus 11 can display a right-eye image. Each of the left-eye display apparatus 12 and the right-eye display apparatus 11 can be configured as the electroluminescent display apparatus in any one or more of FIGS. 1 to 9. In this case, in FIGS. 1 to 9, an upper portion (for example, color filter layers 810 and 820) corresponding to a surface displaying an image can face the lens array 13.

The lens array 13 can be spaced apart from each of the left-eye eyepiece lens 20a and the left-eye display apparatus 12 and can be provided between the left-eye eyepiece lens 20a and the left-eye display apparatus 12. That is, the lens array 13 can be disposed in front of the left-eye eyepiece lens 20a and behind the left-eye display apparatus 12. Also, the lens array 13 can be spaced apart from each of the right-eye eyepiece lens 20b and the right-eye display apparatus 11 and can be provided between the right-eye eyepiece lens 20b and the right-eye display apparatus 11. That is, the lens array 13 can be disposed in front of the right-eye eyepiece lens 20b and behind the right-eye display apparatus 11.

The lens array 13 can be a micro-lens array. The lens array 13 can be replaced by a pin hole array. By using the lens array 13, an image displayed by the left-eye display apparatus 12 or the right-eye display apparatus 11 can be zoomed in by a certain magnification, and thus, a zoomed-in image can be seen by a user.

A left eye LE of a user can be located at the left-eye eyepiece lens 20a, and a right eye RE of the user can be located at the right-eye eyepiece lens 20b.

As seen in FIG. 10C, an HMD apparatus having the AR structure according to the present disclosure can include a left-eye display apparatus 12, a lens array 13, a left-eye eyepiece lens 20a, a transmissive reflection part 14, and a transmissive window 15. In FIG. 10C, for convenience, only left-eye elements are illustrated, and right-eye elements can be the same as the left-eye elements.

The left-eye display apparatus 12, the lens array 13, the left-eye eyepiece lens 20a, the transmissive reflection part 14, and the transmissive window 15 can be accommodated into the accommodating case 10.

The left-eye display apparatus 12 can be disposed in one side (for example, an upper side) of the transmissive reflection part 14 without covering the transmissive window 15. Therefore, the left-eye display apparatus 12 can provide an image to the transmissive reflection part 14 without covering an external background seen through the transmissive window 15.

The left-eye display apparatus 12 can be configured as the electroluminescent display apparatus in any one or more of FIGS. 1 to 9. In this case, in FIGS. 1 to 9, an upper portion (for example, color filter layers 810 and 820) corresponding to a surface displaying an image can face the transmissive reflection part 14.

The lens array 13 can be provided between the left-eye eyepiece lens 20a and the transmissive reflection part 14.

The left eye of the user can be located at the left-eye eyepiece lens 20a.

The transmissive reflection part 14 can be disposed between the lens array 13 and the transmissive window 15. The transmissive reflection part 14 can include a reflection surface 14a which transmits a portion of light and reflects the other portion of the light. The reflection surface 14a can be provided so that an image displayed by the left-eye display apparatus 12 travels to the lens array 13. Accordingly, the user can see, through the transmissive window 15, all of the external background and the image displayed by the left-eye display apparatus 12. That is, the user can see one image which includes a real background and a virtual image, and thus, AR can be implemented.

The transmissive window 15 can be disposed in front of the transmissive reflection part 14.

As described above, according to the embodiments of the present disclosure, since a bank hole is provided in a boundary region between adjacent subpixels and a plurality of grooves are provided under the bank hole, at least a portion of a light emitting layer can be disconnected in a region overlapping the bank hole, and thus, a leakage current can be prevented from occurring between adjacent subpixels, thereby solving a problem where image quality is degraded due to the leakage current.

The above-described feature, structure, and effect of the present disclosure are included in at least one embodiment of the present disclosure, but are not limited to only one embodiment. Furthermore, the feature, structure, and effect described in at least one embodiment of the present disclosure can be implemented through combination or modification of other embodiments by those skilled in the art. Therefore, content associated with the combination and modification should be construed as being within the scope of the present disclosure.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. An electroluminescent display apparatus comprising:
a substrate including a first subpixel and a second subpixel;
a planarization layer on the substrate;
a first electrode in each of the first subpixel and the second subpixel on the planarization layer;
a bank between the first electrode of the first subpixel and the first electrode of the second subpixel;
a light emitting layer on the first electrode of the first subpixel, the first electrode of the second subpixel and the bank; and
a second electrode on the light emitting layer,
wherein the planarization layer comprises a plurality of grooves in a region overlapping the bank,
the bank comprises a bank hole in a region overlapping some of the plurality of grooves, and
the bank hole extends along a boundary between the first subpixel and the second subpixel, and
wherein the light emitting layer includes a first stack, a second stack and a charge generation layer between the first stack and the second stack,
the first stack and the charge generation layer are discontinuous in a region overlapping the bank hole, and the second stack is continuous in the region overlapping the bank hole.

2. The electroluminescent display apparatus of claim 1, wherein the bank hole extends to pass through the bank, and some grooves of the plurality of grooves provided in the planarization layer are exposed at, the bank hole.

3. The electroluminescent display apparatus of claim 1, wherein an inlet of the bank hole comprises:
   a region having a first width,
   a region having a second width which is less than the first width, and
   a region having a width which is progressively reduced from the first width to the second width.

4. The electroluminescent display apparatus of claim 3, wherein an inner portion of the bank hole extending in a downward direction in the region having the first width has a third width which is greater than the first width, and
   an inner portion of the bank hole extending in a downward direction in the region having the second width has a fourth width which is greater than the second width.

5. The electroluminescent display apparatus of claim 1, wherein the inlet of the bank hole has a wave pattern structure in which a shape, where a width thereof increases progressively and then decreases progressively, is repeated.

6. The electroluminescent display apparatus of claim 1, wherein the planarization layer further comprises a flat surface between the some grooves of the plurality of grooves in the region overlapping the bank, and at least a portion of the flat surface is exposed at the bank hole.

7. The electroluminescent display apparatus of claim 1, wherein the plurality of grooves are provided to intersect one another.

8. The electroluminescent display apparatus of claim 1, wherein the plurality of grooves are arranged in a plurality of columns including a first column and a second column in the same direction as an extension direction of the bank hole, and the first column is staggered from the second column in a direction perpendicular to the extension direction of the bank hole.

9. The electroluminescent display apparatus of claim 1, wherein the plurality of grooves are arranged to have the form of columns arranged in a direction perpendicular to an extension direction of the bank hole, and the bank hole is provided to overlap at least one of the columns.

10. The electroluminescent display apparatus of claim 1, wherein
    the bank covers an edge of the first electrode,
    an exposure region, which is exposed without being covered by the bank, of the first electrode configures an emission area, and
    the plurality of grooves do not overlap the emission area.

11. The electroluminescent display apparatus of claim 1, wherein a portion of the first electrode of the first subpixel extends to an inner portion of one groove among the plurality of grooves.

12. The electroluminescent display apparatus of claim 1, wherein the first stack and the charge generation layer are provided in some grooves of the plurality of grooves exposed at the bank hole.

13. The electroluminescent display apparatus of claim 1, further comprising:
    a lens array spaced apart from the substrate; and
    an accommodating case accommodating the substrate and the lens array.

14. An electroluminescent display apparatus comprising:
    a substrate including a first subpixel and a second subpixel;
    a bank area including a bank provided in a boundary between the first subpixel and the second subpixel;
    an emission area defined by the bank area and provided in each of the first subpixel and the second subpixel;
    a light emitting layer provided in the emission area;
    a bank hole area which includes a bank hole extending along the boundary between the first subpixel and the second subpixel and passing through the bank; and
    a groove formation area overlapping the bank hole area under the bank hole area and comprising a plurality of grooves,
    wherein the light emitting layer includes a first stack, a second stack and a charge generation layer between the first stack and the second stack, the first stack and the charge generation layer are discontinuous in a region overlapping the bank hole and the second stack is continuous in the region overlapping the bank hole.

15. The electroluminescent display apparatus of claim 14, wherein a width of an inlet of the bank hole is not constant, and a width of an inner portion of the bank hole extending from the inlet of the bank hole is greater than a width of the inlet of the bank hole.

16. The electroluminescent display apparatus of claim 14, wherein the groove formation area overlaps the bank area.

17. The electroluminescent display apparatus of claim 14, wherein the groove formation area comprises a flat surface provided between the plurality of grooves, and the flat surface and the plurality of grooves are exposed at the bank hole.

18. The electroluminescent display apparatus of claim 14, further comprising:
    a lens array spaced apart from the substrate; and
    an accommodating case accommodating the substrate and the lens array.

* * * * *